United States Patent [19]

Kapoor

[11] Patent Number: 5,943,576
[45] Date of Patent: Aug. 24, 1999

[54] ANGLED IMPLANT TO BUILD MOS TRANSISTORS IN CONTACT HOLES

[75] Inventor: Ashok K. Kapoor, Palo Alto, Calif.

[73] Assignee: National Semiconductor Corporation, Santa Clara, Calif.

[21] Appl. No.: 09/145,135

[22] Filed: Sep. 1, 1998

[51] Int. Cl.[6] ................................................. H01L 21/336
[52] U.S. Cl. .......................... 438/302; 438/525; 438/305
[58] Field of Search .................................... 438/201, 230, 438/231, 232, 246, 247, 256, 257, 259, 261, 263, 264, 279, 290, 289, 301, 302, 303, 305, 306, 576, 582, 583, 525, 618, 622, 675

[56] References Cited

U.S. PATENT DOCUMENTS

| | | | |
|---|---|---|---|
| 3,749,610 | 7/1973 | Swann et al. | 438/301 |
| 3,914,857 | 10/1975 | Goser et al. | 438/525 |
| 5,190,887 | 3/1993 | Tang et al. | 438/525 |
| 5,355,006 | 10/1994 | Iguchi | 438/302 |
| 5,472,897 | 12/1995 | Hsu et al. | 438/303 |
| 5,646,435 | 7/1997 | Hsu et al. | 438/303 |
| 5,670,392 | 9/1997 | Ferla et al. | 438/302 |
| 5,766,998 | 6/1998 | Tseng | 438/305 |
| 5,786,256 | 7/1998 | Gardner et al. | 438/305 |

*Primary Examiner*—Chandra Chaudhari
*Assistant Examiner*—Jack Chen
*Attorney, Agent, or Firm*—Skjerven Morrill MacPherson Franklin & Friel LLP; Edward C. Kwok

[57] ABSTRACT

A method is described which forms an MOS transistor having a narrow diffusion region that is smaller than the diffusion region defined using photoresist in a conventional CMOS processing. In one embodiment, LOCOS can be used to form isolation (e.g., shallow trench) between active devices. A polysilicon layer is then deposited and doped either n+ or p+ selectively. The polysilicon layer is then patterned. Next, a dielectric layer and a refractory layer are deposited over the patterned polysilicon layer. Next, a contact hole with a high aspect ratio is defined in the oxide where the transistor will be formed. Angled implant of lightly-doped drain (LDD) regions or graft source/drain regions are formed on two opposite sides of the contact hole. The refractory metal layer is then removed. Spacers are then formed on opposite sidewall of the contact hole. A gate oxide layer is either thermally grown or deposited in the contact, before or after spacer formation. A gate material is then deposited into the contact hole to form a gate electrode. The gate electrode and the dielectric layer are polished to become coplanar.

14 Claims, 13 Drawing Sheets

5,943,576

ANGLED IMPLANT TO BUILD MOS TRANSISTORS IN CONTACT HOLES

BACKGROUND OF THE INVENTION

1. Field of the Invention

The present invention relates to fabricating integrated circuits, and more specifically, to a method for fabricating a metal-oxide-semiconductor (MOS) transistor.

2. Discussion of the Related Art

FIGS. 1 through 4 illustrate a sequence of steps in a CMOS process. In particular, FIG. 1 shows an epitaxial region 106 on semiconductor substrate 100. Semiconductor substrate 100 can be, for example, a p-type monocrystalline semiconductor, with a thin (5–10 μm thick), lightly doped P-type epitaxial layer 106 at the surface An N-well region (e.g., N-well region 104) is typically provided in epitaxial layer 106 in an "active" region (i.e., where a transistor can be fabricated). To form N-well region 104, a thin oxide 102 (e.g., typically 100–500 Å thick) is grown on epitaxial layer 106. A silicon nitride (SiN) layer 108 is then deposited, patterned and etched. Then, as shown in FIG. 2, a LOCalized Oxidation of Silicon (LOCOS) process is carried out. The exposed portions of the semiconductor surface (i.e., those portions not protected by silicon nitride layer 108) are oxidized to form a thick thermal oxide ("field oxide") 114. The portions of semiconductor surface with thermal oxide 114 is referred to as the field regions. The portions of the semiconductor surface protected by silicon nitride layer 108 become the active regions, where active semiconductor devices are to be fabricated. Thermal oxide 114 isolates devices in active regions from each other. Silicon nitride layer 108 is then removed.

After a masking step creating mask 112, an ion implantation step 116 is carried out through mask 112 to form N-well region 104. Phosphorus or arsenic can be used to form an N-well while boron or $BF_2^+$ can be used to form a P-well. The impurities are then driven in to the appropriate depth during subsequent high temperature cycles. At the conclusion of the drive-in processes the surface concentration in N-well region 104 can be $\sim 1\times 10^{16}/cm^3$ and the surface concentration in a typical P-well is $\leq 1\times 10^{15}/cm^3$. The mask is then removed from the active regions, as shown in FIG. 3 (prior art). NMOS devices can be formed in epitaxial layer 106 or in P-wells, while the PMOS devices are formed in doped (e.g., $1\times 10^{16}/cm^3$) N-well region 104. A threshold adjust implant can then be carried out, followed by growing of a gate oxide.

Polysilicon is deposited by CVD as a material for forming gate electrodes. The polysilicon layer is subsequently doped to form a polysilicon gate material. Polysilicon can be doped either by diffusion or by ion implantation after deposition, or in situ during deposition. The polysilicon is then patterned to form polysilicon gates, such as those designated by reference number 116 in FIG. 4 (prior art).

Next, polysilicon gates 116 are used as a mask to selectively implant the source/drain regions 120 of the transistors. Each of polysilicon gates 116 protects the channel region under the gate from being implanted by dopants 118. Arsenic is the preferable dopant for the n+ source/drain regions (NMOS devices), so that shallow junctions and minimum lateral diffusion under the gate can be obtained. Arsenic is typically implanted to a dose of $3-6\times10^{15}$ cm$^{-2}$, and with an energy of 40–60 keV. Boron is often implanted as $BF_2+$ for the p+ region (for shallow junction formation) at doses of $1-5\times10^{15}$ cm$^{-2}$ and energies of 30–50 kev. These implants are usually performed through a screen oxide to protect source/drain regions 120 from contamination during the implant procedure. These implants are then annealed with a short thermal process at a temperature ranging from 800–1100° C.

In the above-described conventional CMOS process, the implant area is generally defined by an oxide or other masking material opening on the surface of the silicon. The size of this opening is determined by the resolution of the photoresist process which can be limited by many aspects of the process, including hardware (e.g. diffraction of light, lens aberrations, and mechanical stability of the system); optical properties of the resist material (e.g. contrast, swelling behavior, and thermal flow); and process characteristics (e.g. softbake step, develop step, postbake step, and etching step). Thus, the size for the diffusion regions which are the source and the drain of the transistor are limited by the photoresist process.

A process for fabricating an MOS transistor having a narrow diffusion region smaller than the resolution of a photo resist process, using conventional CMOS fabrication techniques, is desired.

SUMMARY OF THE INVENTION

A method for forming a MOS transistor having a narrow diffusion region that is smaller than the diffusion region produced by a photoresist process is described herein which utilizes standard CMOS processing. In one embodiment, LOCOS provides a standard isolation structure, such as a shallow trench. The surface of the isolation structure is then cleaned. A polysilicon layer is then deposited and doped either n+ or p+ selectively. The polysilicon layer is then patterned. Next, a dielectric layer is deposited over the doped polysilicon layer. A refractory metal layer is then deposited over the dielectric layer. Next, a contact hole with a high aspect ratio is defined in the oxide where the transistor is to be formed. Angled implant to form lightly doped drain (LDD) structures, or alternatively, graft source/drain structures, are carried out from two opposite sides only. The refractory metal layer is then removed. The surface of the wafer is cleaned and the implant is activated. Sidewall spacers are then formed in the contact hole. A gate oxide layer is either thermally grown or deposited in the contact hole. The remainder of the contact hole is then filled with a gate material to form a gate electrode. Next, the gate material is polished so that the top of the gate is coplanar with the dielectric layer. In another embodiment, a gate oxide layer is grown before deposition of the spacer material.

The present invention is better understood upon consideration of the detailed description below and the accompanying drawings.

BRIEF DESCRIPTION OF THE DRAWINGS

FIG. 3 (prior art) shows well 104 formation and well drive-in.

Like reference numbers are provided to like elements in the various figures.

DETAILED DESCRIPTION OF THE PREFERRED EMBODIMENTS

Figure 1:
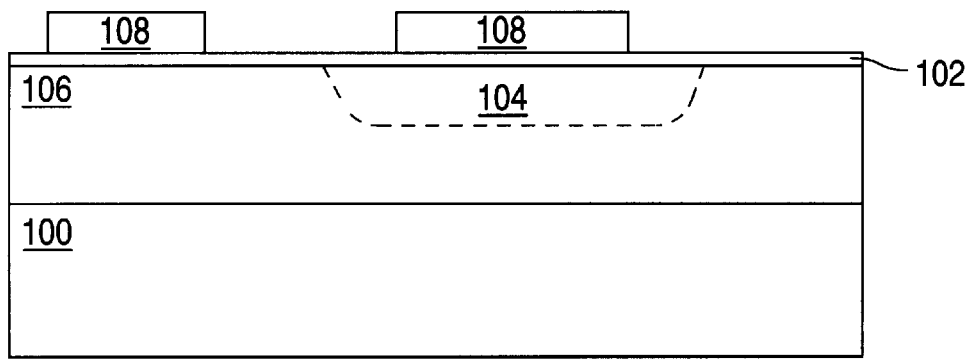
FIG. 1 (prior art) shows the location of well 104 in field oxide 106 and nitride mask 108 defining active areas.
Figure 2:
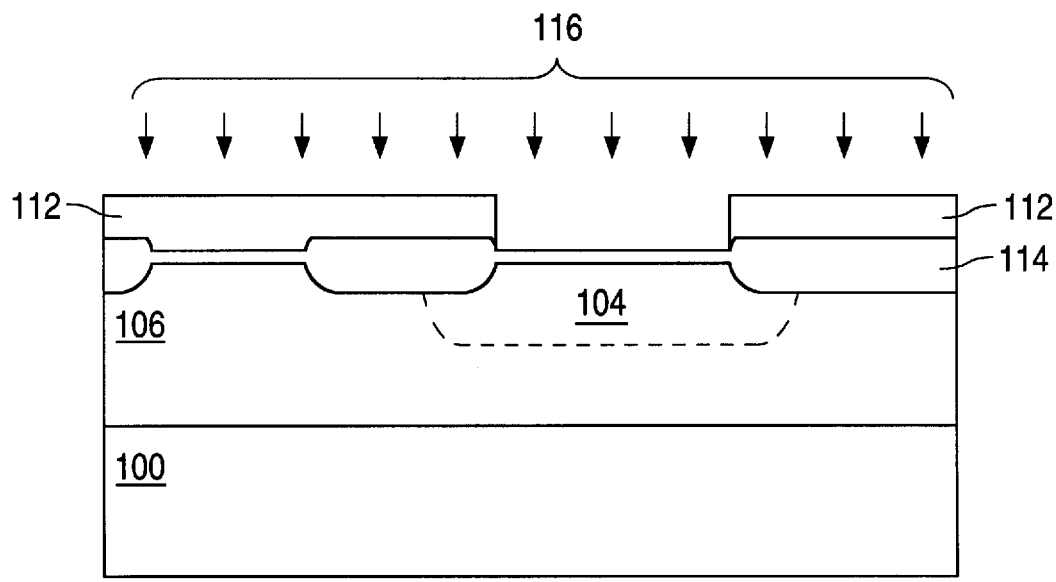
FIG. 2 (prior art) shows LOCOS 114 and field implant 116 through mask 112.
Figure 3:
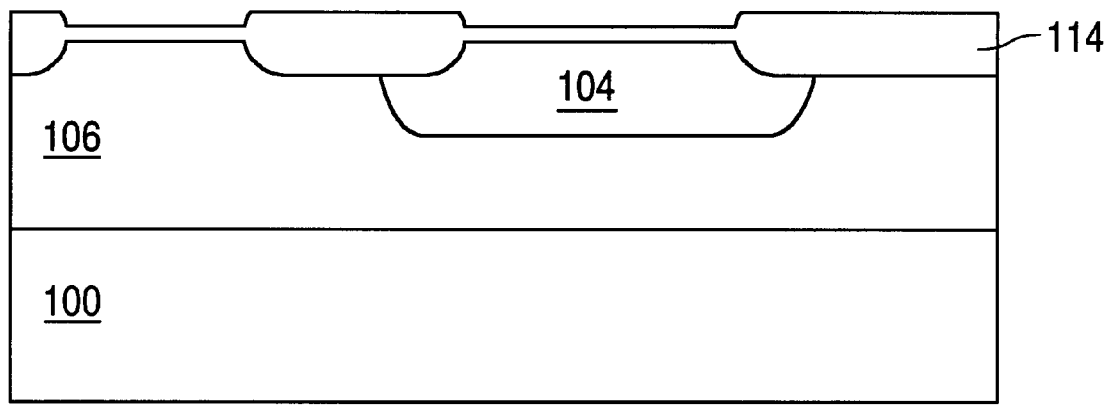
Figure 4:
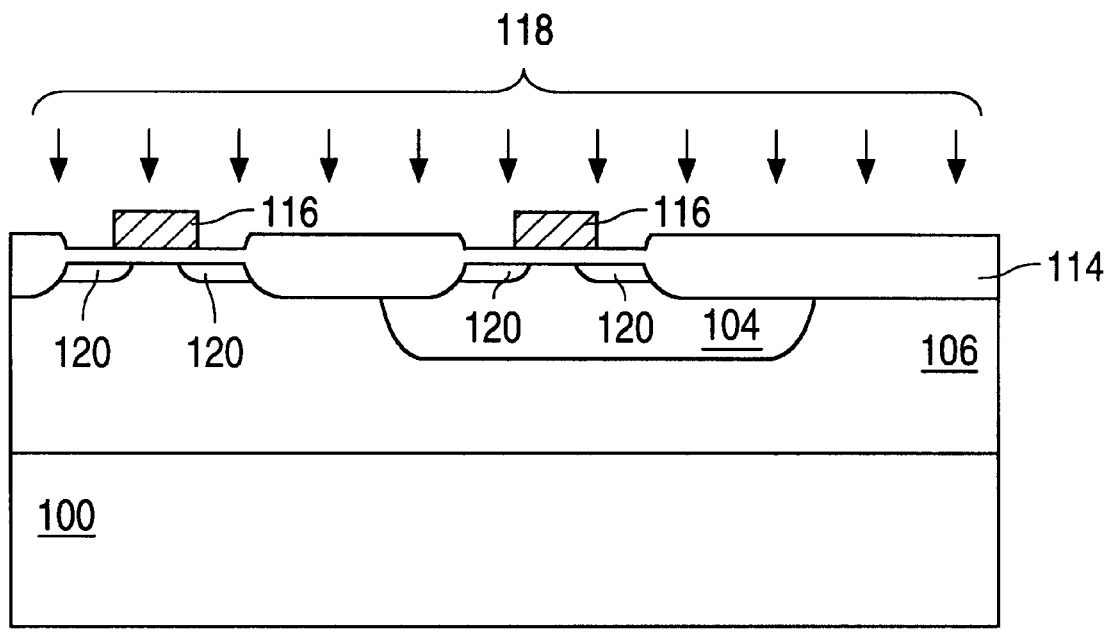
FIG. 4 (prior art) shows gate/source/drain formation.

A method for forming an MOS transistor, having a narrow diffusion region that is smaller than what can be made using a conventional photoresist process, is described herein. The specific materials and processes set forth below illustrate the present invention. The present invention may be practiced in numerous modifications and variations to the embodiments described below, and therefore the described embodiments are not limiting.

An example of the present invention is shown in FIGS. 5 through 11. Referring to FIG. 5A, a simplified cross-sectional view of structure 10 at an early step of a CMOS process flow is shown. Structure 10 includes a P-type semiconductor substrate 400 having a thickness between approximately 1000 to 5000 micrometers ($\mu$m) and having a resistivity of between approximately 0.1 to 10 ohm-centimeter ($\Omega$-cm). Of course, the resistivity and thickness of semiconductor substrate 400 depend upon the desired characteristics of the devices to be formed therein. The conductivity types described with respect to structure 10 may alternatively be reversed while still realizing the benefits of the invention.

Structure 10 also includes field oxide 414 which is formed using a conventional isolation process such as LOCalized Oxidation of Silicon (LOCOS) or a shallow trench, so as to provide electrical isolation for each transistor device. The surface of field oxide 414 is then cleaned. Next, a polysilicon layer 412 is deposited over the cleaned surface. Polysilicon layer 412 is then doped to have n-type conductivity for NMOS transistors, or alternatively, p-type conductivity for PMOS transistors. Polysilicon layer 412 is then patterned.

Next, a dielectric layer 404 is blanket deposited over polysilicon layer 412. Dielectric layer 404 is typically silicon dioxide ($SiO_2$) but can be any other dielectric material. Dielectric layer 404 can have a thickness of between 0.1 and 1.0 $\mu$m.

Next, a refractory metal layer 406 with a thickness ranging between 0.05 and 0.5 $\mu$m is deposited over dielectric layer 404. Refractory metal layer 406 is typically tungsten (W), but can be any high-atomic weight metal Then, a masking layer is disposed over refractory metal layer 406. Refractory metal layer 406, dielectric layer 404 and polysilicon layer 412 are patterned to form numerous contact holes in the wafer (e.g., contact hole 402). These contact holes each have a high aspect ratio (i.e., each contact hole is much deeper than it is wide). Note that all contact holes are of the same width and are arranged in parallel rows on the wafer.

Next, dopant 408 is implanted at an angle θ, to create a source/drain region 410 underneath polysilicon layer 412 on one side of contact hole 402. Angle θ can be 60–70°, depending upon the exact dimensions of doped polysilicon layer 412, dielectric layer 404 and refractory metal layer 406. The nominal value of θ is given by the expression θ=$\tan^{-1}${(x+y)/z}, where: (a) x is the thickness of refractory metal 406, (b) y is the thickness of dielectric layer 404, and (c) z is the width of contact hole 402. Refractory metal layer 406 stops dopant 408 from entering semiconductor substrate 400, so that the ion implantation step can better define source/drain region 410. Without refractory metal layer 406, the diffusion areas will be large, thus forming a less sharply defined source/drain region 410.

Dopant 408 can be a P-type dopant for a P-type transistor (e.g., boron atoms ($B^+$), at an energy of between approximately 5 and 30 keV and a dose of between approximately $1\times10^{13}$ to $1\times10^{15}$ ions/cm$^2$, or $BF_2^+$, at an energy of approximately 10 keV to 60 keV with a dose of between approximately $1\times10^{13}$ to $1\times10^{16}$ ions/cm$^2$). For an N-type transistor, dopant 408 can be an N-type dopant (e.g., arsenic ($As^+$), at an energy of between approximately 10 and 100 keV and a dose of between approximately $1\times10^{13}$ to $1\times10^{16}$ ions/cm$^2$, or phosphorous (p+), at an energy of between approximately 5 to 50 keV and a dose of between approximately $1\times10^{13}$ to $1\times10^{16}$ ions/cm$^2$).

Figure 5A:
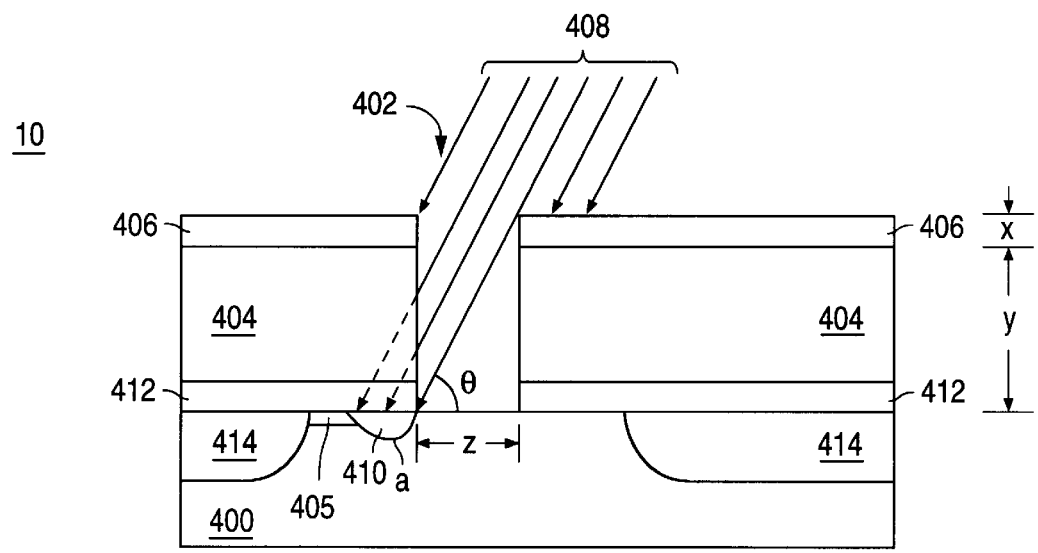
FIG. 5A shows formation of source/drain region 410 through angled implant 408.

While some atoms of dopant 408 are stopped by refractory metal 406, the remaining atoms of dopant 408 travel relatively far in dielectric layer 404. Consequently, source/drain region 410 is formed such that highest concentration of dopant 408 is found at point "a" where there is no little obstruction in the ion implantation path. The concentration decreases away from point "a" laterally further into the portion of substrate underneath polysilicon layer 412. As shown in FIG. 5a, a doped region 405 can be formed by out-diffusion of dopants from polysilicon layer 412.

Figure 5B:
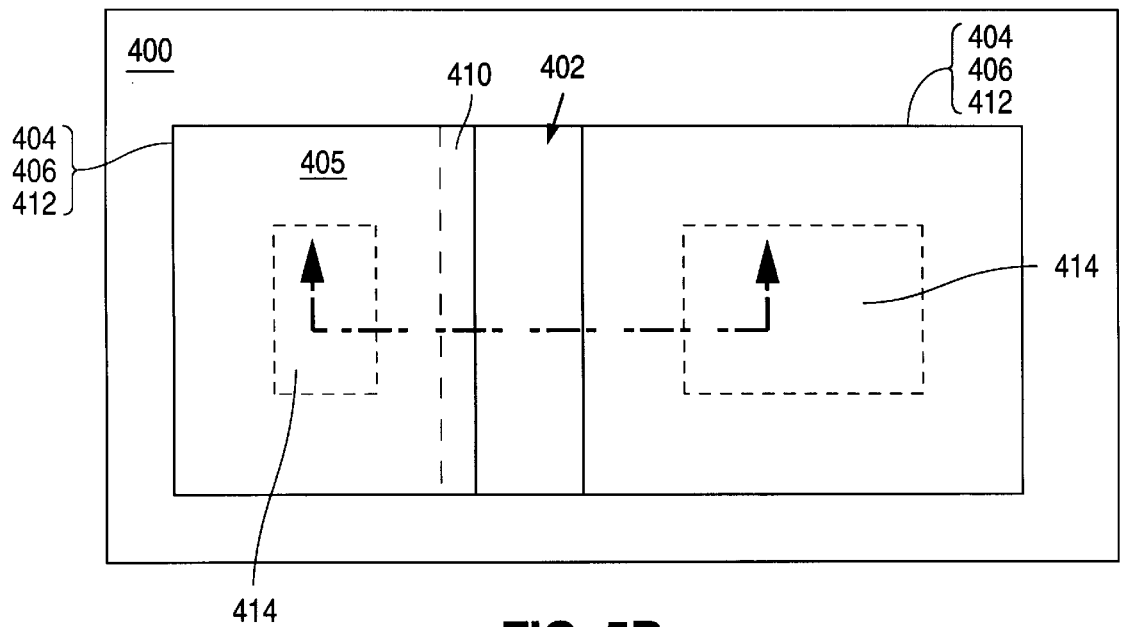
FIG. 5B is a top view of the device depicted in FIG. 5A.

Since source/drain region 410 is not defined by conventional techniques (i.e., implanting through an opening in oxide or other masking material on the surface of the silicon directly above the area designated for source/drain region 410), the size of the source/drain region 410 is not limited by the resolution of the photoresist process. FIG. 5B shows a top view of structure 10 shown in FIG. 5A.

Figure 6A:
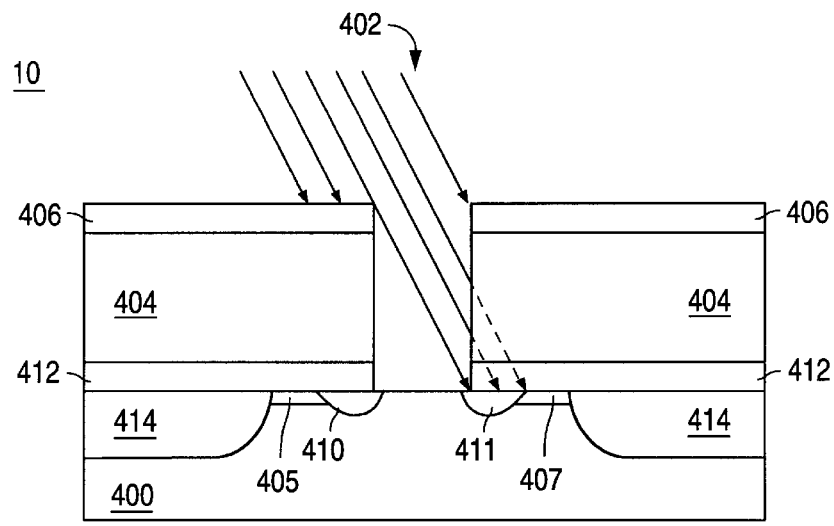
FIG. 6A shows locations of source/drain regions 410 and 411 after angled implant from 2 sides.
Figure 6B:
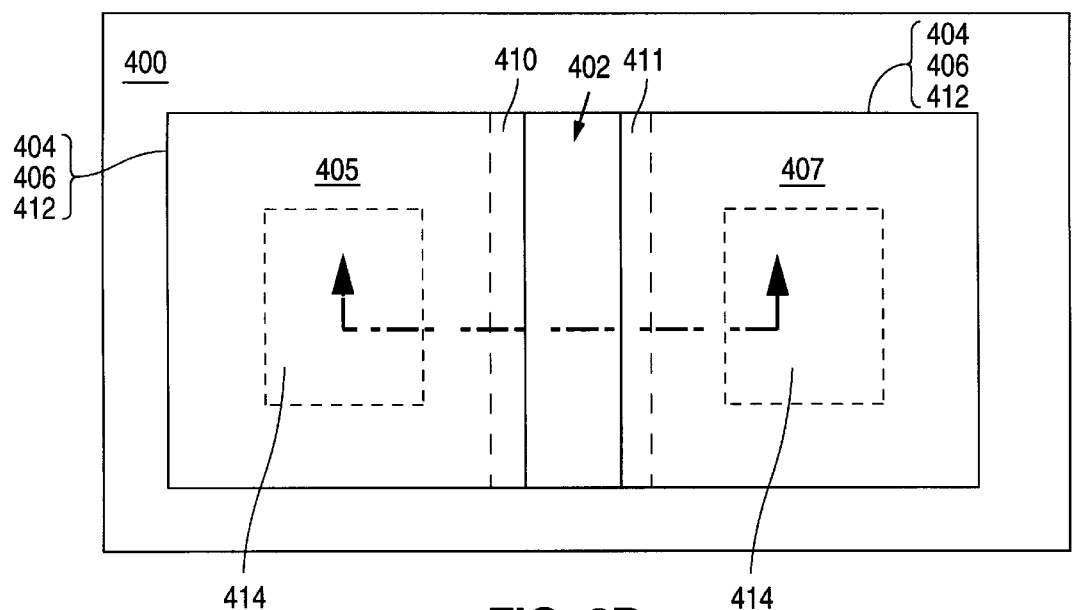
FIG. 6B is a top view of the device depicted in FIG. 6A.

FIG. 6A shows another source/drain region (i.e., source/drain region 411), which is formed by implanting from the opposite direction on the side of contact hole 402 opposite source/drain region 410. As in region 405, region 407 is formed by out-diffusion of dopants from doped polysilicon layer 412. FIG. 6B shows a top view of the structure shown in FIG. 6A.

Figure 7A:
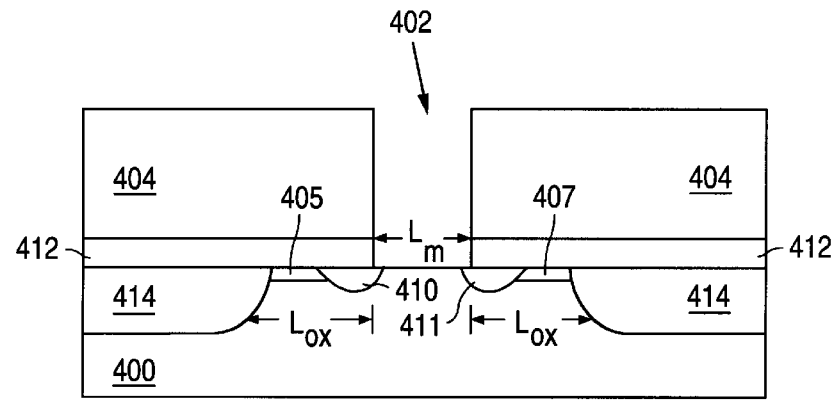
FIG. 7A shows the location and the dimension of the transistor to be formed.

Next, refractory metal layer 406 is removed, such as by polishing over a predetermined time period, as shown in FIG. 7A. Because the thickness of refractory metal layer 406 can be controlled to relatively high precision, the required polishing time can be determined.

Because polysilicon is conductive, doped polysilicon layer 412 can be used as conductors for connecting source/drain regions 410 and 411 to other circuit elements formed in or on substrate 400. As a result, conventional contacts for interconnecting circuit elements on or in substrate 400 may not be necessary. As discussed below, a transistor is formed by providing a channel region between source/drain regions 410 and 411 in a subsequent step. Thus, contact hole 402 defines the location and the dimension of a transistor which, as shown in FIG. 7A, has a lateral extent of $L_m + 2L_{ox}$, where $L_m$ is the width of contact hole 402, and $L_{ox}$ is the lateral distance between an edge of contact hole 402 to an edge of field oxide region 414.

Figure 7B:
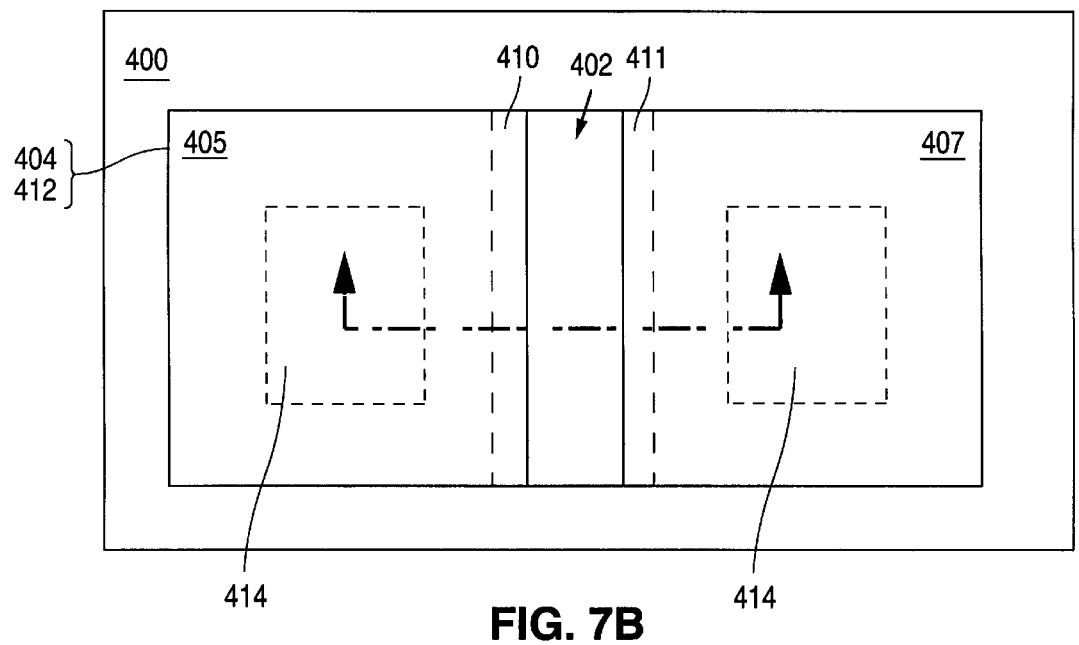
FIG. 7B is a top view of the device depicted in FIG. 7A.

After refractory metal layer 406 is removed, the surface is cleaned and the implanted species are activated, using a conventional technique. FIG. 7B shows a top view of the structure shown in FIG. 7A.

Figure 8A:
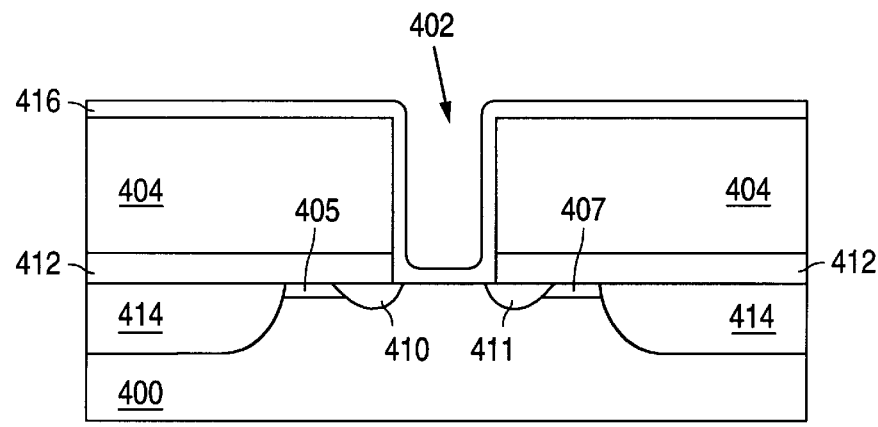
FIG. 8A shows a spacer material 416 blanket deposited over dielectric layer 404 into contact hole 402.
Figure 8B:
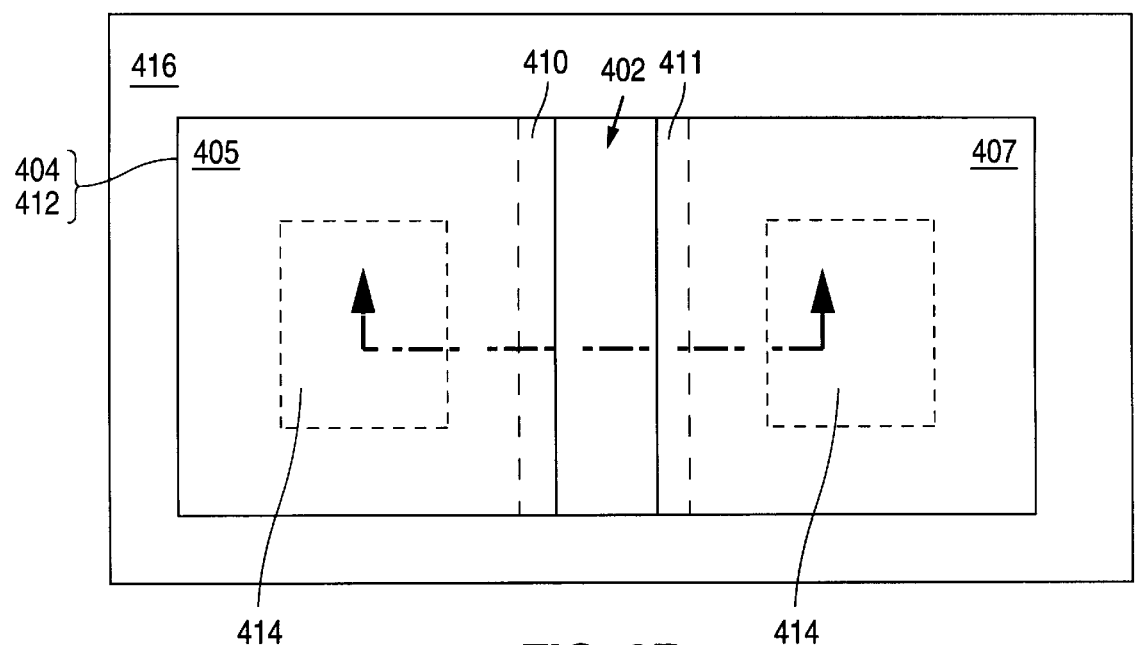
FIG. 8B is a top view of the device depicted in FIG. 8A.
Figure 9A:
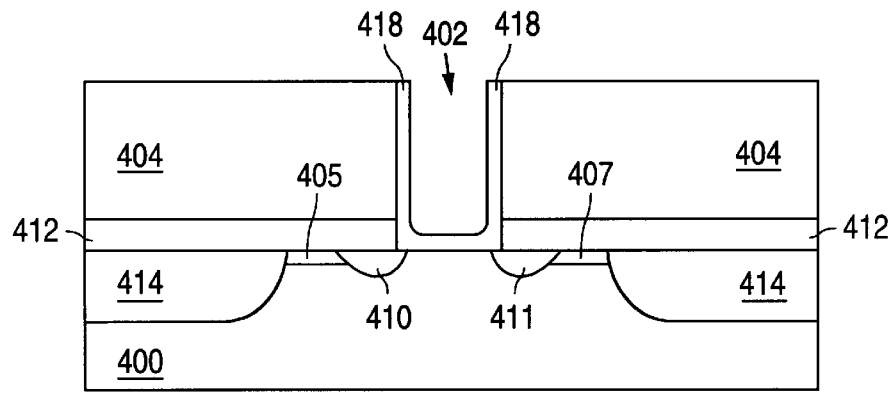
FIG. 9A shows sidewall spacers 418 formed adjacent to the side walls of contact hole 402.
Figure 9B:
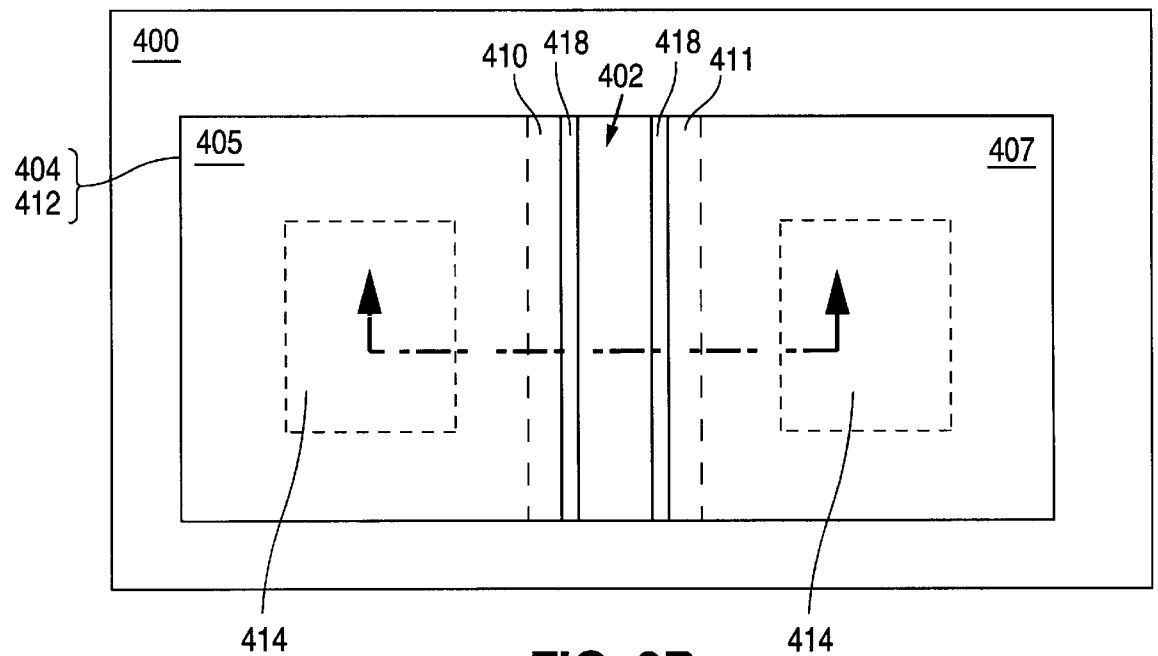
FIG. 9B is a top view of the device depicted in FIG. 9A.

Next, as shown in FIG. 8A, a nitride layer 416 is blanket deposited over dielectric layer 404. FIG. 8B shows a top view of the structure shown in FIG. 8A. Nitride layer 416 is then anisotropically etched back to form sidewall spacers 418 as shown in FIG. 9A. In this embodiment, sidewall spacers 418 are each typically 700 Å thick, but can be any thickness between 100 to 2000 Å. To avoid over-etch and damage to dielectric layer 404, a low-energy etch is preferred for etching nitride layer 416. FIG. 9B shows a top view of the structure shown in FIG. 9A.

Figure 10A:
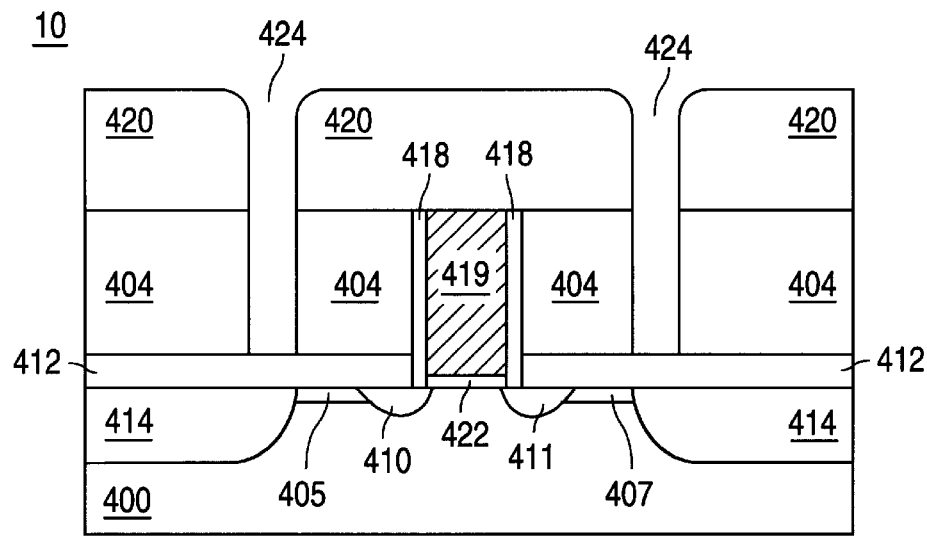
FIG. 10A shows gate oxide 422, remainder of contact hole 402 filled with a gate contact material 419, dielectric layer 420, and contact hole 424.
Figure 10B:
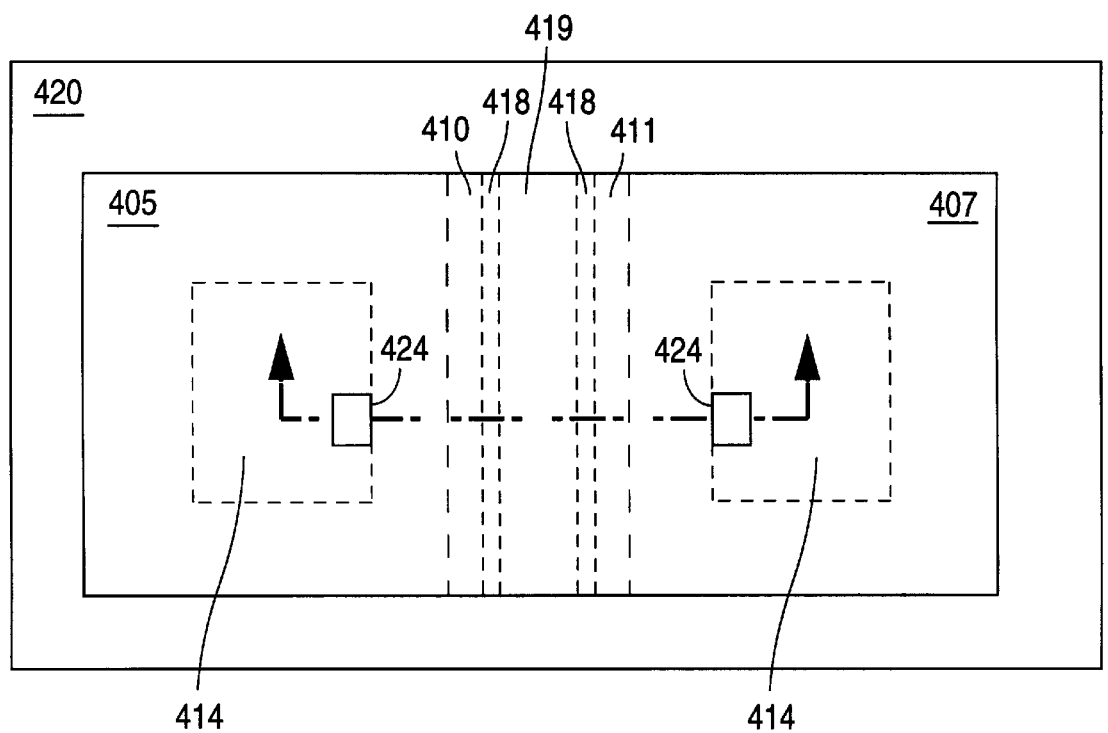
FIG. 10B is a top view of the device depicted in FIG. 10A.

Thereafter, as shown in FIG. 10A, a gate oxide 422, typically 10–200 Å, is thermally grown or deposited in contact hole 402. Into contact hole 402 is then deposited a gate material 419 to form a gate electrode. Gate material can be, for example, titanium nitride (TiN) or doped polysilicon. Gate contact material 419 is then polished so the top of the gate is coplanar with sidewall spacers 418 and dielectric layer 404. Dielectric layer 420 is then deposited and contact holes 424 formed. FIG. 10B shows a top view of the structure shown in FIG. 10A.

Figure 11A:
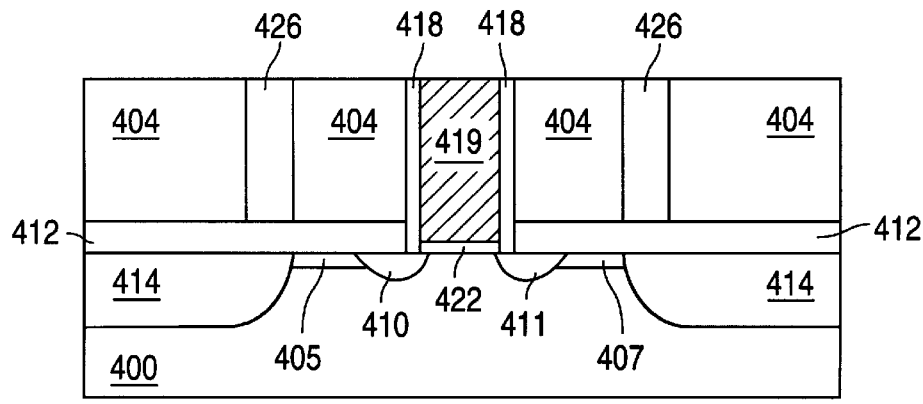
FIG. 11A shows planarization of contacts 426 to be coplanar with gate contact material 419.
Figure 11B:
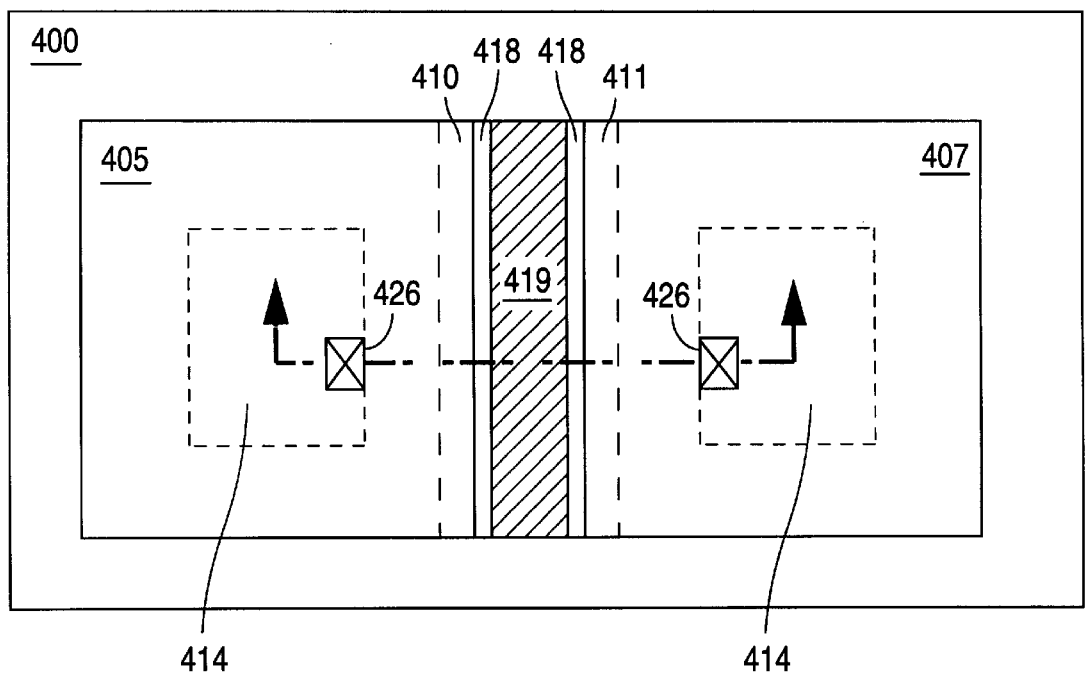
FIG. 11B is a top view of the device depicted in FIG. 11A.

Dielectric layer 420 is then removed, as shown in FIG. 11A. Contact holes 424 are then filled with a conductive material and planarized, thereby forming contact structures 426, which provide contact through patterned polysilicon layer 412 to source/drain regions 410 and 411 of the transistor. Notice that gate electrode 419 is directly on top of gate oxide 422, so that lateral contacts for connecting to gate electrode 419 may not be necessary. In fact, other devices can be placed directly above gate electrode 419 to form a compact rectangular transistor structure. A rectangular device allows very tightly packed placement of transistors. Furthermore, doped polysilicon layer 412 can be patterned to form buried contacts for connecting source/drain regions of multiple transistors. FIG. 11B shows a top view of the structure shown in FIG. 11A.

Figure 12A:
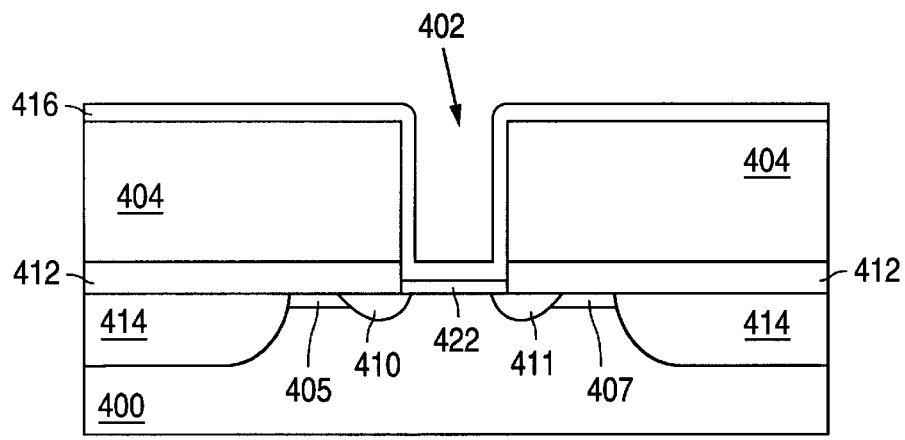
FIG. 12A shows a gate oxide 422 deposited or thermally grown before deposition of a spacer material 416.
Figure 12B:
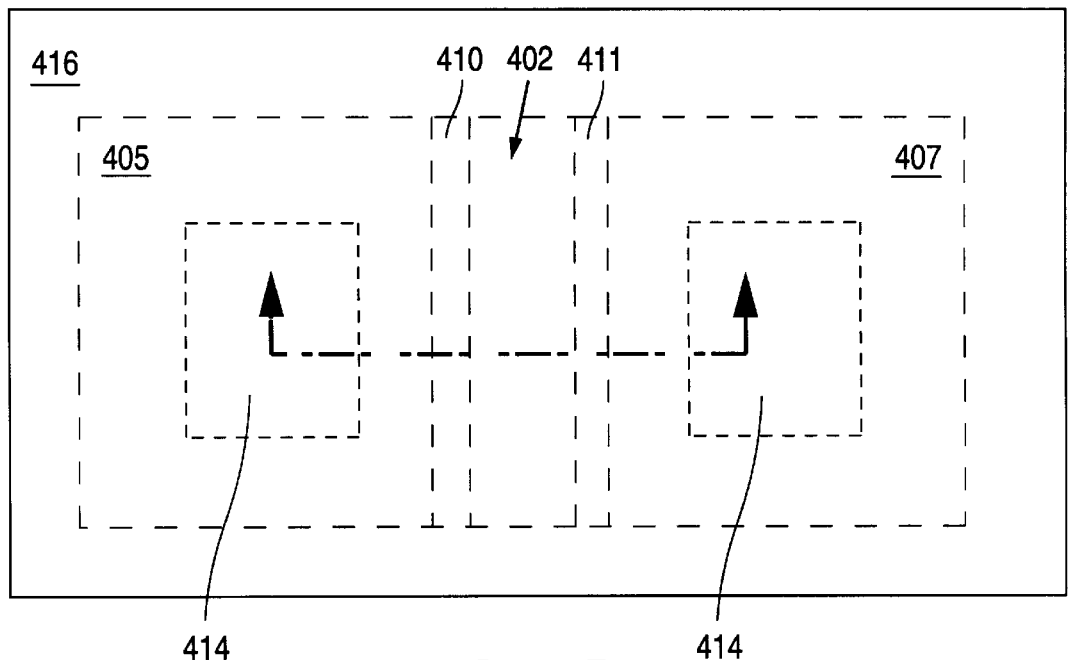
FIG. 12B is a top view of the device depicted in FIG. 12A.

Alternatively, as shown in FIG. 12A, prior to depositing nitride layer 416, as in FIG. 8A, gate oxide 422 can be grown. Nitride layer 416 can then be deposited. FIG. 12B shows a top view of the structure shown in FIG. 12A.

Figure 13A:
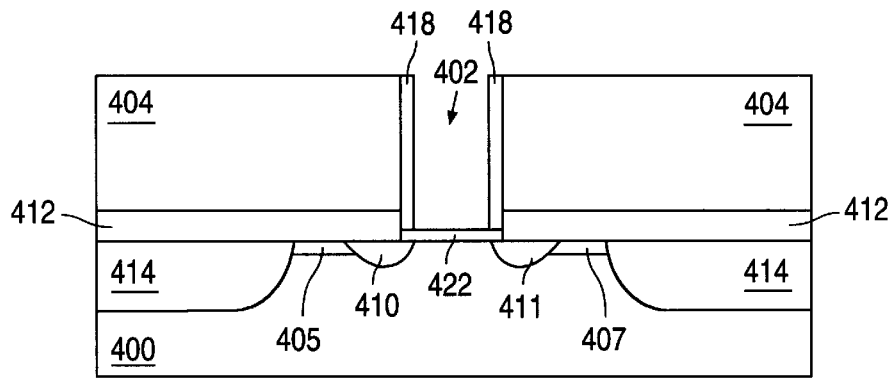
FIG. 13A shows formation of spacers 418.
Figure 13B:
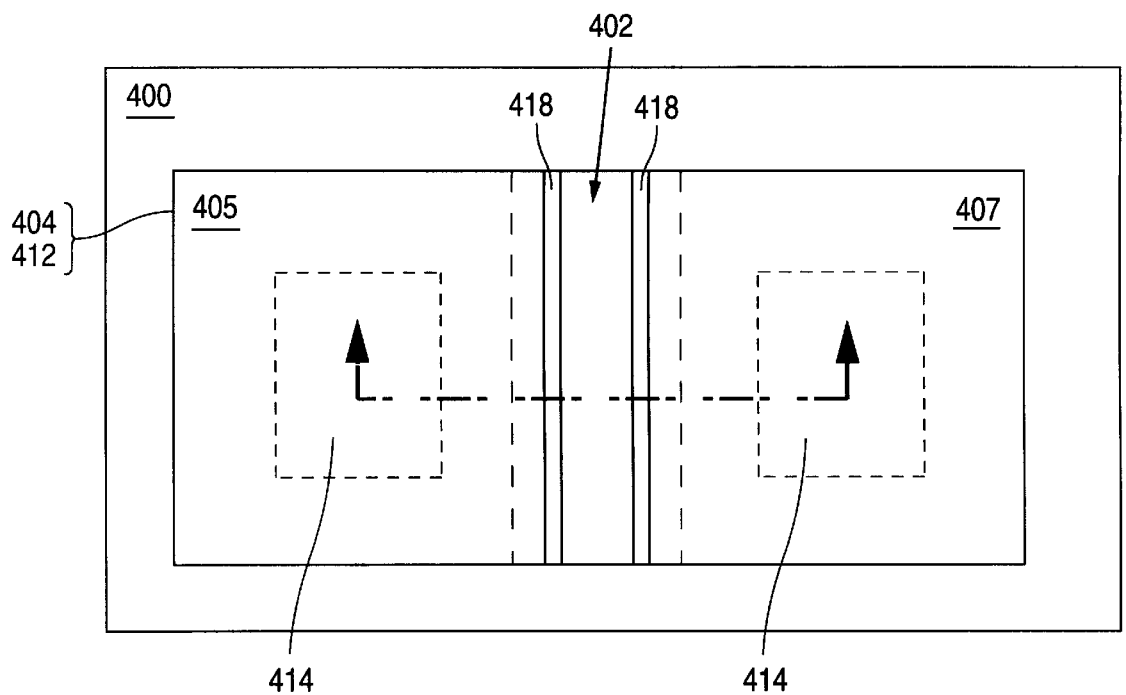
FIG. 13B is a top view of the device depicted in FIG. 13A.

Nitride layer 416 is then etched with high selectivity of nitride layer 416 over dielectric layer 404, thereby forming sidewall spacers 418, as shown in FIG. 13A. FIG. 13B shows a top view of the structure shown in FIG. 13A.

Figure 14A:
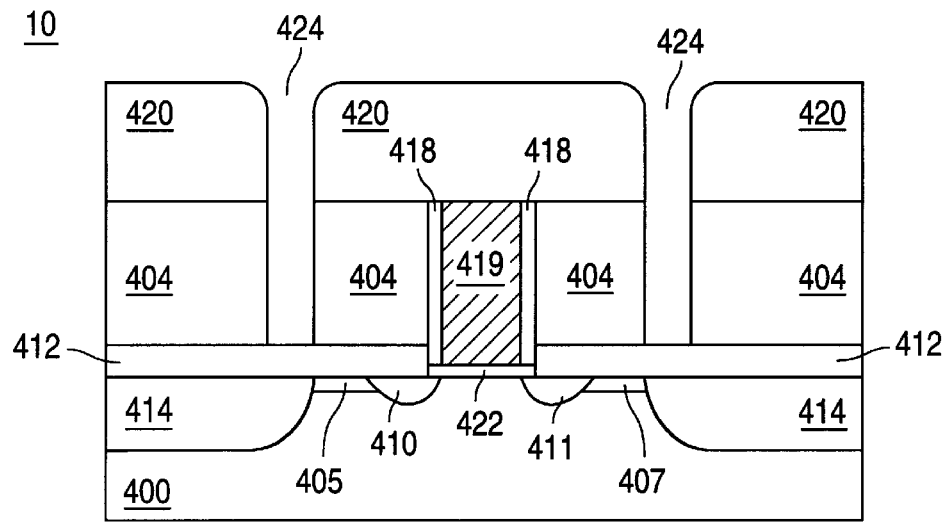
FIG. 14A shows contact hole 402 filled with a gate contact material 419, dielectric layer 420, and contact hole 424.
Figure 14B:
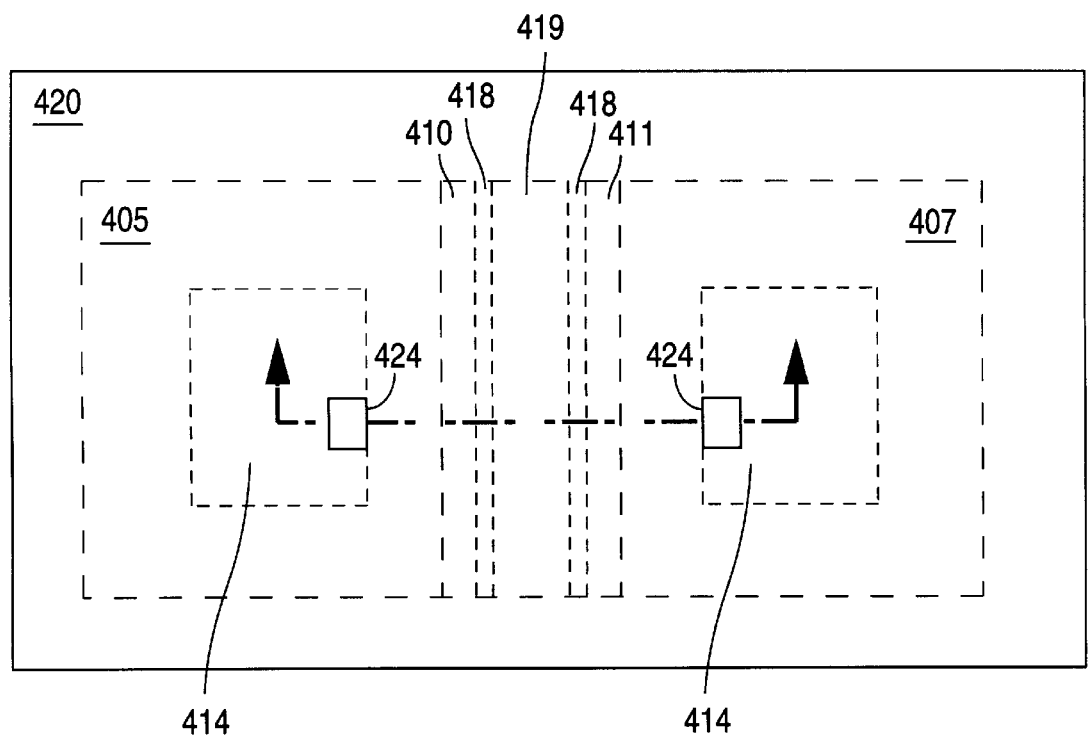
FIG. 14B is a top view of the device depicted in FIG. 14A.

As shown in FIG. 14A, contact hole 402 is then filled by a gate material 419 (e.g., TiN or doped polysilicon) to form a gate electrode. Gate electrode 419 is then polished to become coplanar with sidewall spacers 418 and dielectric layer 404. Dielectric layer 420 is then deposited on top of the resulting structure and contact holes 424 are then cut. FIG. 14B shows a top view of the structure shown in FIG. 14A.

Figure 15A:
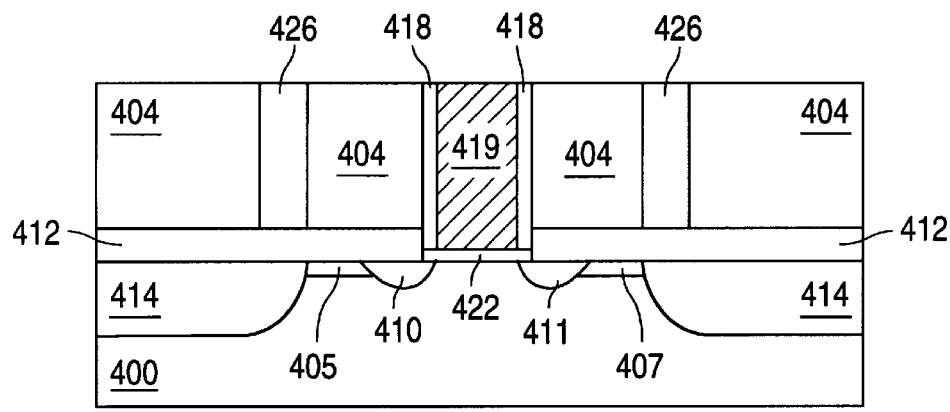
FIG. 15A shows planarization of contacts 426 to be coplanar with gate contact material 419.
Figure 15B:
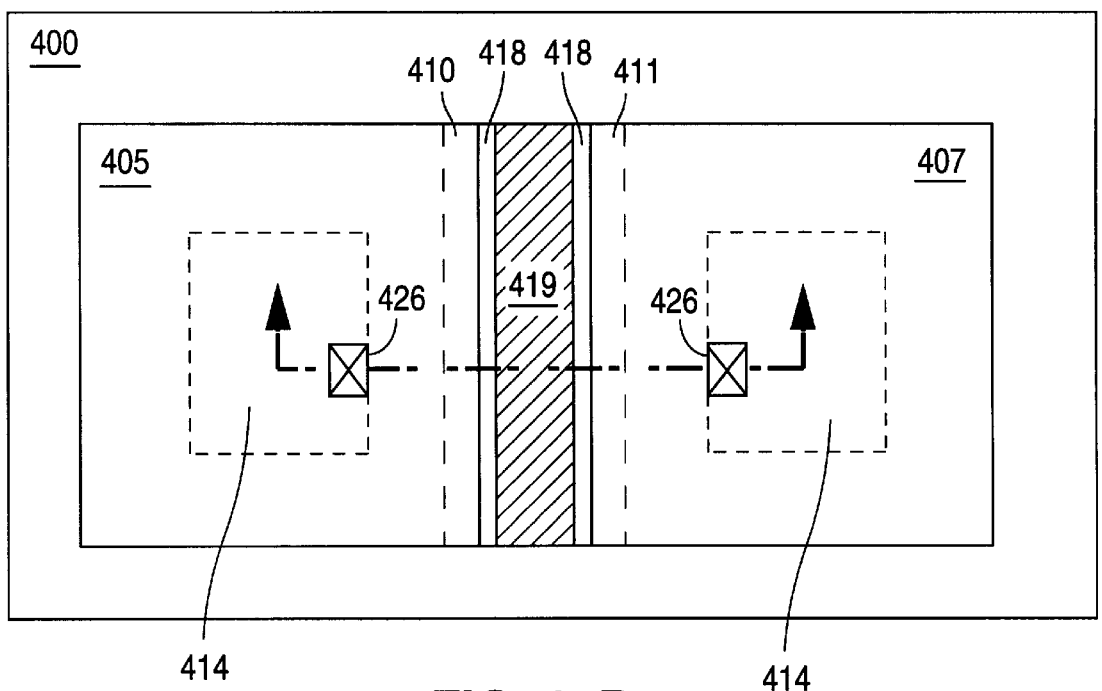
FIG. 15B is a top view of the device depicted in FIG. 15A.

Dielectric layer 420 is then removed, as shown in FIG. 15A. Contact holes 424 are then filled with a conductive material and planarized, thus forming contacts 426 to polysilicon layer 412. FIG. 15B shows a top view of the structure shown in FIG. 15A.

The above detailed description is provided to illustrate specific embodiments of the present invention. The present invention is particularly pointed out and distinctly claimed in the following appended claims.

I claim:

1. A method of forming a portion of an MOS transistor, comprising:

depositing a polysilicon layer over a semiconductor substrate of a first conductivity type;

depositing above said polysilicon layer a dielectric layer and a refractory metal layer;

forming a contact hole through said refractory metal layer, said dielectric layer, and said polysilicon layer to expose a portion of said semiconductor substrate;

implanting a dopant at a first angle other than an angle normal to a substrate surface, to form a first source/drain region in said semiconductor substrate under said polysilicon layer on a first side of said contact hole, said first source/drain region having a conductivity type opposite said first conductivity type;

implanting said dopant at a second angle other than an angle normal to said substrate surface, to form a second source/drain region in said semiconductor substrate under said polysilicon layer on an opposite side of said first side of said contact hole, said second source/drain region having a conductivity type opposite said first conductivity type;

removing said refractory metal layer; and forming a gate electrode in said contact hole.

2. The method of claim 1 wherein said dielectric layer comprises silicon dioxide.

3. The method of claim 1 wherein said refractory metal layer comprises tungsten.

4. The method of claim 1 wherein said dopant in said implanting steps comprises boron atoms, said implanting steps being carried out at an energy selected from the range 5 KeV to 30 KeV.

5. A method of forming a portion of an MOS transistor, comprising:

depositing a polysilicon layer over a semiconductor substrate;

depositing above said polysilicon layer a dielectric layer and a refractory metal layer;

forming a contact hole through said refractory metal layer, said dielectric layer, and said polysilicon layer to expose a portion of said semiconductor substrate;

implanting a dopant at a first angle other than an angle normal to a substrate surface, to form a first source/drain region in said semiconductor substrate under said polysilicon layer on a first side of said contact hole;

implanting said dopant at a second angle other than an angle normal to said substrate surface, to form a second source/drain region in said semiconductor substrate under said polysilicon layer on an opposite side of said first side of said contact hole;

removing said refractory metal layer;

forming spacers on the side walls of said contact hole;

providing a gate dielectric in said contact hole above said exposed semiconductor substrate; and depositing a gate material into said contact hole, thereby forming a gate electrode.

6. A method as in claim 5, wherein said gate dielectric is formed prior to said spacers.

7. A method as in claim 5, further comprising the step of planarizing said gate electrode to become flush with said dielectric layer.

8. A method as in claim 5, wherein said spacer material comprises silicon nitride.

9. A method as in claim 5, wherein said gate dielectric comprises thermally grown silicon oxide.

10. A method as in claim 5, wherein said gate dielectric comprises a deposited silicon oxide.

11. A method as in claim 5, wherein said gate material comprises doped polysilicon.

12. A method as in claim 5, wherein said spacers are formed by an anisotropic etch.

13. The method of claim 1 wherein said dopant in said implanting steps comprises boron-fluoride atoms, said implanting steps being carried out at an energy selected from a range of energy which includes the range 10 KeV to 60 KeV.

14. The method of claim 1 wherein said first angle is selected from a range of angles which includes the range 60° to 70°.

* * * * *